(12) United States Patent
Yang

(10) Patent No.: US 7,728,338 B2
(45) Date of Patent: Jun. 1, 2010

(54) NITRIDE SEMICONDUCTOR LIGHT EMITTING DEVICE AND FABRICATING METHOD THEREOF

(75) Inventor: Seung Huyn Yang, Gwangjoo-shi (KR)

(73) Assignee: LG Innotek Co., Ltd, Seoul (KR)

( * ) Notice: Subject to any disclaimer, the term of this patent is extended or adjusted under 35 U.S.C. 154(b) by 486 days.

(21) Appl. No.: 10/592,573

(22) PCT Filed: Nov. 4, 2005

(86) PCT No.: PCT/KR2005/003702

§ 371 (c)(1),
(2), (4) Date: Sep. 12, 2006

(87) PCT Pub. No.: WO2006/052068

PCT Pub. Date: May 18, 2006

(65) Prior Publication Data

US 2008/0142779 A1    Jun. 19, 2008

(30) Foreign Application Priority Data

Nov. 11, 2004  (KR) .............. 10-2004-0092097

(51) Int. Cl.
  *H01L 33/32* (2010.01)
(52) U.S. Cl. ........... 257/97; 257/E33.027; 257/E33.033
(58) Field of Classification Search .......... 257/E33.023, 257/E33.026, E33.03, E33.033, 96.97, E33.027, 257/E33.028, E33.032
See application file for complete search history.

(56) References Cited

U.S. PATENT DOCUMENTS

| 6,586,762 B2 * | 7/2003 | Kozaki ................. 257/14 |
| 6,645,885 B2 * | 11/2003 | Chua et al. ............. 438/509 |
| 6,806,502 B2 * | 10/2004 | Iyechika et al. ............ 257/79 |

FOREIGN PATENT DOCUMENTS

| JP | 11-26812 A | 1/1999 |
| JP | 11-74622 A | 3/1999 |
| JP | 2000-174366 A | 6/2000 |
| JP | 2000-286202 A | 10/2000 |
| JP | 2002-158374 A | 5/2002 |
| KR | 2001-48266 A | 2/2001 |
| KR | 2003-0083820 A | 11/2003 |
| KR | 10-2004-0047132 A | 6/2004 |

* cited by examiner

*Primary Examiner*—Minh-Loan T Tran
*Assistant Examiner*—W. Wendy Kuo
(74) *Attorney, Agent, or Firm*—Birch, Stewart, Kolasch & Birch, LLP

(57) ABSTRACT

A nitride semiconductor light emitting device including: a first nitride semiconductor layer, an active layer formed on the first nitride semiconductor layer and including at least one barrier layer grown under hydrogen atmosphere of a high temperature; and a second nitride semi conductor layer formed on the active layer, and a method of fabricating the same are provided. According to the light emitting device and method of fabricating the same, the light power of the light emitting device is increased and the operation reliability is enhanced.

18 Claims, 3 Drawing Sheets

[Fig. 1]
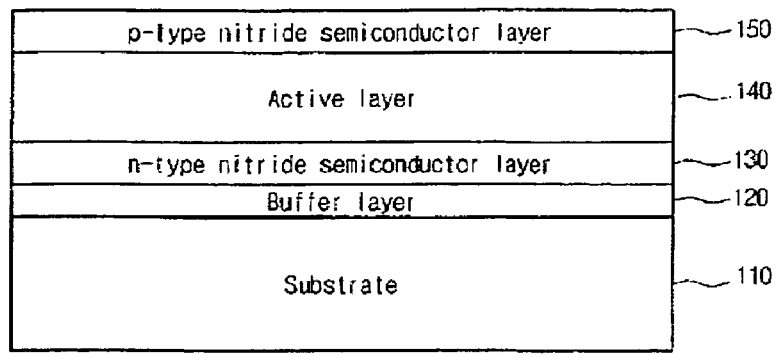
[Fig. 2]
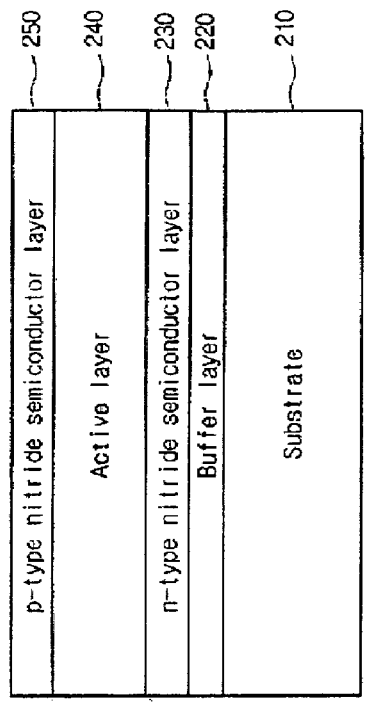
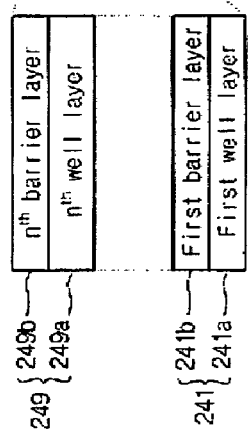

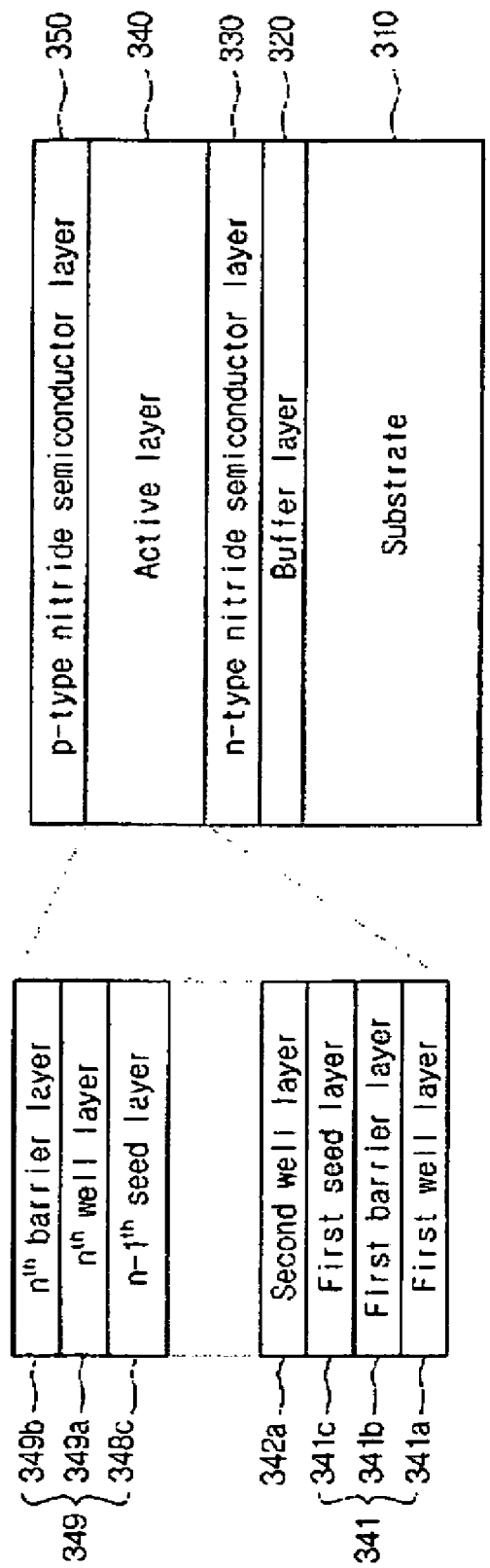

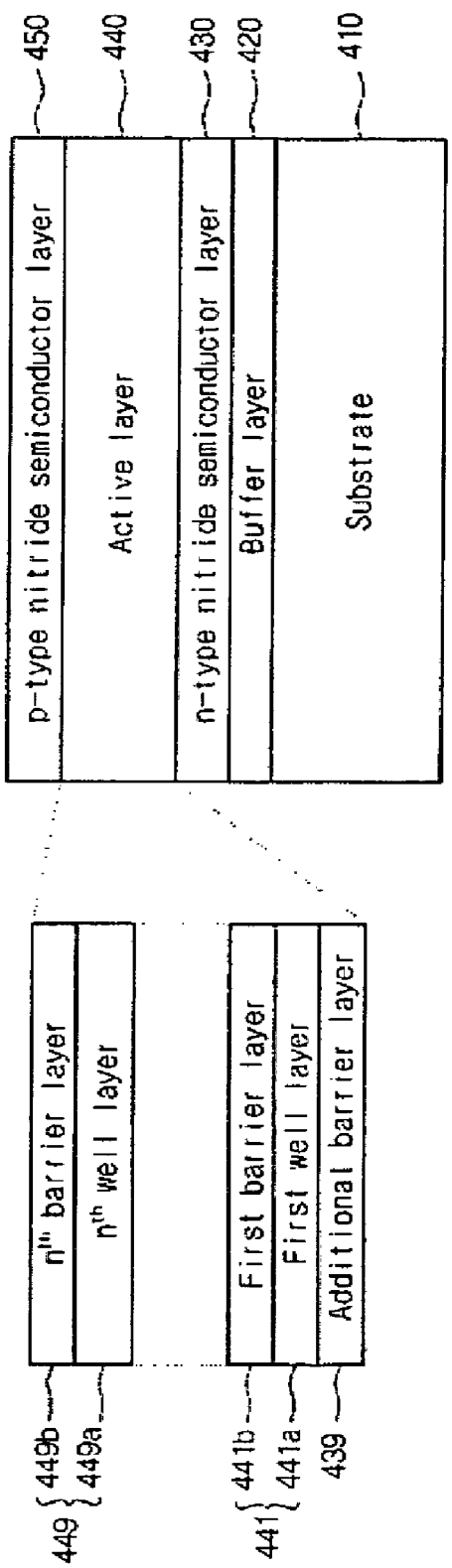
[Fig. 4]

NITRIDE SEMICONDUCTOR LIGHT EMITTING DEVICE AND FABRICATING METHOD THEREOF

TECHNICAL FIELD

The present invention relates to a nitride semiconductor light emitting device and fabrication method thereof, and more particularly, to a nitride semiconductor light emitting device and fabrication method thereof that can enhance the light power and reliability of the light emitting device.

BACKGROUND ART

In general, nitride semiconductors are in the limelight as a material for blue light emitting diodes, blue laser diodes or the like.

FIG. 1 is a sectional view of a general nitride semiconductor light emitting device.

Referring to FIG. 1, the general nitride semiconductor light emitting device includes a sapphire substrate 110, a buffer layer 120 formed on the sapphire substrate 110, an n-type nitride semiconductor layer 130 formed on the buffer layer 120, an active layer 140 formed on the n-type nitride semiconductor layer 130, and a p-type nitride semiconductor layer 150 formed on the active layer 140.

The n- and p-type nitride semiconductor layers 130 and 150 are formed by doping a variety of dopants into a gallium nitride (GaN). Representative example of n-type dopants includes silicon (Si), and representative example of p-type dopants includes magnesium (Mg).

The active layer is a layer through which light emits. As a representative growth method of the active layer, and is generally made in an $In_xGa_{1-x}N$ ($0 \leq x \leq 1$) single well structure or multi-well structure in which Indium (In) and gallium (Ga) are contained in predetermined ratios. The active layer of $In_xGa_{1-x}N$ ($0 \leq x \leq 1$) is generally grown under an environment of nitrogen atmosphere and at a temperature of less than 900° C.

In detail, a general growth method below 900° C. is performed in a nitrogen (N2) atmosphere for a proper composition ratio of In and Ga. However, in the thin film growth of $In_xGa_{1-x}N$ ($0 \leq x \leq 1$), as the In introduction amount into GaN increases or the Ga introduction amount into InN increases, a serious phase dissociation phenomenon occurs, which is problematic. To solve such a phase dissociation phenomenon, if the growth temperature is increased, In phase dissociation phenomenon increases, which makes it difficult to obtain a good quality thin layer.

Meanwhile, when the active layer is grown in a relatively low temperature, In segregation occurs from thin InGaN layer, which deteriorates the layer quality, and many crystal defects also occur at an interface between $In_xGa_{1-x}N$ ($0 \leq x \leq 1$) and GaN due to a lattice difference therebetween. Also, the In phase dissociation phenomenon increases, which makes it difficult to obtain a good quality layer, and also the occurring crystal defects are combined with crystal defects of a lower structure to decrease the light emitting efficiency and the device reliability.

Finally, in the related alt growth method, in the case of the materials, such as InGaN/GaN, a strong piezo electric field is generated inside the active layer because of a stress due to a large lattice mismatch, and electron-hole wave functions are separated, resulting in a deterioration in the light emitting efficiency.

DISCLOSURE OF INVENTION

Technical Problem

The present invention is to provide a nitride semiconductor light emitting device that can enhance the crystallinity of $In_xGa_{1-x}N$ ($0 \leq x \leq 1$) constituting an active layer by decreasing crystal defects due to a large lattice mismatch between $In_xGa_{1-x}N$ ($0 \leq x \leq 1$) and $In_yGa_{1-y}N$ ($0 \leq y \leq 1$) of a nitride semiconductor.

Also, the present invention is to provide a nitride semiconductor light emitting device having a low driving voltage and a high light emitting efficiency in which the light emitting efficiency is increased due to a thin active layer having $In_xGa_{1-x}N$ ($0 \leq x \leq 1$) of In composition and a fabrication method thereof.

Also, the present invention is to provide a nitride semiconductor light emitting device having an enhanced light power and reliability and a fabrication method thereof.

Technical Solution

There is provided a nitride semiconductor light emitting device including: a first nitride semiconductor layer; an active layer formed on the first nitride semiconductor layer and including at least one barrier layer grown under hydrogen atmosphere of a high temperature; and a second nitride semiconductor layer formed on the active layer.

Also, there is provided a nitride semiconductor light emitting device including: a buffer layer; a first nitride semiconductor layer formed on the buffer layer; an active layer formed on the first nitride semiconductor layer and including at least a pair of a well layer and a barrier layer having an IN (indium) composition ratio of less than 10%; and a second nitride semiconductor layer formed on the active layer.

Also, there is provided a method of fabricating a nitride semiconductor light emitting device, the method including: forming a first nitride semiconductor layer, forming an active layer on the first nitride semiconductor layer, the forming of the active layer including forming a well layer and a barrier layer grown under a hydrogen atmosphere at a high temperature; and forming a second nitride semiconductor layer on the active layer.

ADVANTAGEOUS EFFECTS

According to the nitride semiconductor light emitting device of the present invention, a barrier layer grown in a hydrogen atmosphere at a high temperature decreases crystal defects due to a large lattice mismatch between a well layer and the barrier layer constituting the active layer and enhances the crystallinity of the active layer.

Also, the light emitting device with a high light power and an increased reliability can be obtained.

BRIEF DESCRIPTION OF THE DRAWINGS

The spirit of the present invention will be understood from the accompanying drawings. In the drawings:

FIG. 1 is a sectional view of a general nitride semiconductor light emitting device;

FIG. 2 a sectional view of a nitride semiconductor light emitting device according to a first embodiment of the present invention;

FIG. 3 a sectional view of a nitride semiconductor tight emitting device according to a second embodiment of the present invention; and FIG. 4 a sectional view of a nitride semiconductor light emitting device according to a third embodiment of the present invention.

BEST MODE FOR CARRYING OUT THE INVENTION

Hereinafter, preferred embodiments of the present invention will be described in detail with reference to accompanying drawings.

First Embodiment

FIG. 2 a sectional view of a nitride semiconductor light emitting device according to a first embodiment of the present invention.

Referring to FIG. 2, the nitride semiconductor light emitting device according to the present invention includes a buffer layer 220 formed on a substrate 210, an n-type nitride semiconductor layer 230 formed on the buffer layer 220, an active layer 240 formed oil the n-type nitride semiconductor layer 230, the active layer 240 including well layers 241a, 249a and barrier layers 241b, 249b, and a p-type nitride semiconductor layer 250 formed on the active layer 240.

In detail, the active layer 240 is formed between the n-type nitride semiconductor layer 230 and the p-type nitride semiconductor layer 250. In particular, the active layer 240 is characterized by including the barrier layers 241b, 249b grown in a high temperature hydrogen atmosphere so as to reduce crystal defects.

Also, the active layer 240 may have a single quantum well structure consisting of a first well layer 241a and a first barrier layer 241b, or a multi-quantum well structure consisting of a plurality of well layers 241a, 249a and a plurality of barrier layers 241b, 249b alternatively formed. Preferably, the plurality of well layers 241a, 249a and the plurality of barrier layers 241b, 249b are arranged to include 4 to 10 pails of periodically repeated well layers and barrier layer, each pair consisting of one well layer and one barrier layer.

Also, it is preferable that each of the well layers 241a, 249a should have a composition of $In_xGa_{1-x}N$ ($0 \leq x \leq 1$) of which In composition ratio is 10-20% and each of the barrier layers 241b, 249b should have a composition of $In_yGa_{1-y}N$ ($0 \leq y \leq 1$) of which in composition ratio is below 10%.

Hereinafter, a method of fabricating a nitride semiconductor light emitting device according to an embodiment of the present invention will be described.

First, a buffer layer 220 is formed on a substrate 210. The substrate 210 may be a sapphire substrate, a silicon substrate or a silicon carbide (SiC) substrate, which are widely used in the nitride semiconductor light emitting devices.

Next, an n-type nitride semiconductor layer 230 serving as a first nitride semiconductor layer is formed on the buffer layer 220. After the n-type nitride semiconductor layer 230 is formed, a process step of forming an active layer 240 is performed.

Describing the process step of fondling the active layer 240 in more detail, a well layer 241a having a composition of $In_xGa_{1-x}N$ ($0 \leq x \leq 1$) is formed on the n-type nitride semiconductor layer 230. Preferably, the well layer 241a is formed with a composition of $In_xGa_{1-x}N$ ($0 \leq x \leq 1$) of which In composition ratio is 10% to 20%. After the well layer 241a is formed, a barrier layer 241b having a composition of $In_yGa_{1-y}N$ ($0 \leq y \leq 1$) is formed on the well layer 241a. Preferably, the barrier layer 241b is formed with a composition of $In_yGa_{1-y}N$ ($0 \leq y \leq 1$) of which In composition ratio is below 10%.

Herein, the barrier layer 241b is formed at a thickness range of 30-200 Å in a high temperature hydrogen atmosphere. If the barrier layer 241b is formed so thin, the crystal defects-removing effects, such as defects, inclusion or the like generated in a boundary between $In_xGa_{1-x}N$ ($0 \leq x \leq 1$) and $In_yGa_{1-y}N$ ($0 \leq y \leq 1$) constituting the well layers and the barrier layers, are decreased, so that the device performance enhancement effect is reduced. Accordingly, it is preferable that the barrier layer 241b be 30 Å or more thick. Further, if the barrier layer 241b is formed so thick, the resistance, which is happening during fabrication of device, is increased, so that the electrical characteristics and the light emitting efficiency of the device are lowered. Accordingly, it is preferable that the barrier layer 241b be 200 Å or less thick. Resultantly, it is preferable that the barrier layer 241b be formed at a thickness range of 30-200 Å.

In addition, when the barrier layer 241b is formed in the hydrogen atmosphere above 900° C. according to the present invention, it shows remarkably decreased crystal defects, compared with the related art barrier layer of $In_yGa_{1-y}N$ ($0 \leq y \leq 1$) having a multi-well structure formed in a temperature below 900° C. However, if the growth temperature of the barrier layer 241b exceeds 1,040° C., the crystal defects increase. To this end, it is preferable that the temperature range for the formation of the barrier layer 241b be in a range of 900-1,040° C.

By the above process steps, the active layer 240 is formed with a single quantum well structure consisting of a single well layer 241a and a single barrier layer 241b or a multi-quantum well structure consisting of a plurality of well layers and barrier layers alternatively arranged.

After the active layer 240 is formed, a p-type nitride semiconductor layer 250 serving as a second nitride semiconductor layer is formed on the active layer 240.

The barrier layer suppresses crystal defects existing in the lower structure of the substrate 210, the buffer layer 220 and the n-type nitride semiconductor layer 230 and dislocations such as defects or inclusions occurring in a boundary between $In_xGa_{1-x}N$ ($0 \leq x \leq 1$) and $In_yGa_{1-y}N$ ($0 \leq y \leq 1$) from being propagated, thereby enhancing the device reliability. Hence, the light power of the light emitting device is improved and the device reliability is increased.

Second Embodiment

Hereinafter, a nitride semiconductor light emitting device and fabrication method thereof according to a second embodiment of the present invention will be described.

FIG. 3 a sectional view of a nitride semiconductor light emitting device according to a second embodiment of the present invention.

Referring to FIG. 3, the nitride semiconductor light emitting device according to the present invention includes a buffer layer 320 formed on a substrate 310, an n-type nitride semiconductor layer 330 formed on the buffer layer 320, an active layer 340 formed on the n-type nitride semiconductor layer 330, the active layer 340 including at least barrier layers 341b, 349b, and a p-type nitride semiconductor layer 350 formed on the active layer 340.

The active layer 340 is formed between the n-type nitride semiconductor layer 330 and the p-type nitride semiconductor layer 350. The active layer 340 includes the barrier layers 341b, 349b grown in a high temperature nitrogen atmosphere so as to decrease crystal defects. One period of the active layer 340 includes a first well layer 341a formed on the n-type nitride semiconductor layer 330, a first barrier layer 341b grown on the first well layer 341a in a high temperature hydrogen atmosphere, and a seed layer 341c formed on the first barrier layer 341b.

In detail, the active layer 340 includes a plurality of well layers 341a, 349a, a plurality of barrier layers 341b, 349b and a plurality of seed layers 341c, 349c alternatively arranged. Preferably, the plurality of well layers 341a, 349a, the plurality of barrier layers 341b, 349b and the plurality of seed layers 341c, 349c, one period consisting of one well layer, one barrier layer and one seed layer, are formed in four or ten periods.

The seed layers 341c, 348c are grown with a composition of $In_zGa_{1-z}N$ (0<z<1) or a single layer of InN. The seed layers serve as a seed while the well layers are formed directly on the seed layers such that In is sufficiently introduced into the well layers.

The nitride semiconductor light emitting device thus formed according to the second embodiment of the present invention is characterized by including forming the seed layers prior to forming the well layers such that the characteristics of the well layers are improved and In is sufficiently supplied into the well layers.

Hereinafter, a method of fabricating the nitride semiconductor light emitting device according to the second embodiment of the present invention will be described in detail.

First, a buffer layer 320 is formed on a substrate 310. Next, an n-type nitride semiconductor layer 330 serving as a first nitride semiconductor layer is formed on the buffer layer 320. After the n-type nitride semiconductor layer 330 is formed, a process step of forming an active layer 340 is performed.

To form the active layer 340, a well layer 341a having a composition of $In_xGa_{1-x}N$ ($0 \leq x \leq 1$) is formed on the n-type nitride semiconductor layer 330. After the well layer 341a is formed, a barrier layer 341b is formed on the well layer 341a. Since the process steps from the forming of the n-type nitride semiconductor layer 330 to the forming of the barrier layer 341b are the same as those in the first embodiment, their detailed description will be omitted.

After the barrier layer 341b is formed, a seed layer 341c is formed with a composition of $In_zGa_{1-z}N$ (0<z<1) or in a single layer of InN. The seed layer 341c serves as a seed while a well layer 342a is formed with a composition of $In_xGa_{1-x}N$ ($0 \leq x \leq 1$) such that In is sufficiently supplied into the well layer 342a with a composition of $In_xGa_{1-x}N$ ($0 \leq x \leq 1$). Accordingly, a carrier localization caused by a phase dissociation of the inside of the well layer or a non-uniform In composition becomes adjustable. Meanwhile, a composition ratio of In in the seed layer 341c with a composition of $In_zGa_{1-z}N$ is preferably above 10% to an overall composition.

In a general case, the well layer with a composition of $In_xGa_{1-x}N$ ($0 \leq x \leq 1$) has a composition ratio containing 15% In. In order to increase the In composition ratio of the well layer 342a in the nitride semiconductor light emitting device according to the present invention, the In composition ratio in $In_zGa_{1-z}N$ (0<z<1) constituting the seed layer 341c is made above 10%. By doing so, In introduction effect into the well layer increases, so that the well layer 342a can be formed with a composition ratio containing 15% or more In.

The seed layer 341c of a single layer of $In_zGa_{1-z}N$ (0<z<1) or InN is preferably grown at a thickness below 20 Å. This is because if the seed layer 341c is thicker than the well layer 342a, In isolation phenomenon may occurs at a boundary between the seed layer 341c and the well layer 342a, which results in the deterioration in the layer quality or in the light emitting characteristic.

After the seed layer 341c is grown, a heat treatment of the seed layer 341c may be added. Example of the heat treatment includes a process step of thermally annealing the seed layer 341c at the same temperature as the growth temperature of the seed layer 341c or a process step of elevating the growth temperature while the well layer 342b is grown. The above heat treatment promotes In introduced into the seed layer 341c to form a lattice bond with Nitrogen (N) and also helps Ga and In to bond with each other while the well layer 342a is formed.

After the seed layer 341c is formed, well layer 342a is formed with a composition of $In_xGa_{1-x}N$ ($0 \leq x \leq 1$). While the well layer 342a is formed with the composition of $In_xGa_{1-x}N$ ($0 \leq x \leq 1$), a sufficient amount of In is introduced into the well layer 342a from the seed layer 341c formed in the previous process step. Accordingly, a high temperature growth of active layer can be induced to obtain thin active layer having the high quality composition of $In_xGa_{1-x}N$ ($0 \leq x \leq 1$).

Resultantly, a nitride semiconductor light emitting device having a high light emitting efficiency can be obtained due to the carrier localization effect of the high quality thin InGaN layer having the high In composition ratio.

Through the above process steps, a single quantum well structure consisting of the well layer 341a/barrier layer 341b/seed layer 341c can be obtained or a multi-quantum well structure further including a plurality of well layers/barrier layers/seed layers additively grown on the seed layer 341c of the single quantum well structure can be obtained.

In forming the final quantum well structure of the active layer 349, the well layer 349a and the barrier layer 349b are formed, but the seed layer is omitted, which is because an additional well layer does not exist on the seed layer if formed, and the barrier layer 349b directly contacts the p-type nitride semiconductor layer 350 to obtain a normal operation environment of light emitting device due to the formation of a contact layer.

Subsequently, a p-type nitride semiconductor layer serving as a second nitride semiconductor layer 350 is formed on the active layer 340.

Elements, which are not particularly described in the above description for the second embodiment, can be referred from the description of the first embodiment.

The characteristics of the nitride semiconductor light emitting device according to the second embodiment will now be described.

The barrier layers 341b, 349b in the active layer 340 are grown in the high temperature hydrogen atmosphere to reduce the crystal defects. Accordingly, the crystal defects of the lower structure including the substrate 310, the buffer layer 320 and the n-type nitride semiconductor layer 330, and the dislocations, such as the defects or inclusions, occurring at the boundary between $In_xGa_{1-x}N$ ($0 \leq x \leq 1$) and $In_yGa_{1-y}N$ ($0 \leq y \leq 1$), can be prevented from being propagated, thereby enhancing the device reliability.

Also, while the nitride semiconductor light emitting, device according to the present invention is fabricated, the seed layers 341c, 348c help In to be sufficiently introduced into the well layers 342a, 349a having the composition of $In_xGa_{1-x}N$ ($0 \leq x \leq 1$) during the growth of the well layers 342a, 349a. The above behavior of the seed layers 341c, 348c induces a natural rise of the growth temperature being caused by the high In composition ratio such that a thin InGaN layer grown at a high temperature can be obtained, thereby enhancing the light emitting efficiency due to the carrier localization effect.

Recent research results show that an energy band gap of InN is a very small value of 0.7 eV (corresponds to a wavelength of 1,771 nanometers), which means that the energy gap of InxGa1−xN ($0 \leq x \leq 1$) includes infrared ray region to ultra violet ray region. Accordingly, it is possible to fabricate an LCD emitting lights at all wavelengths.

However, according to the nitride semiconductor light emitting device and fabrication method thereof provided in the first and second embodiments, since the first well layers 241a, 341a are grown directly on the n-type nitride semiconductor layers 230, 330, respectively, the lattice structure defects of the first well layers 241a, 341a may not be sufficiently reduced.

Third Embodiment

The third embodiment of the present invention is provided to solve the above drawback, and provides a fabrication method with a structure that can cope with the lattice structure defects of the first well layers 241a, 341a first grown.

FIG. 4 a sectional view of a nitride semiconductor light emitting device according to a third embodiment of the present invention.

Referring to FIG. 4, to solve lattice structure defects of a first well layer 441a, an additional barrier layer 439 is further formed between the first well layer 441a and an n-type nitride semiconductor layer 430, which is to remove the crystal defects of the first well layer 441a and at the same time to stably operate the light emitting device. The additional barrier layer 439 is grown in a high temperature hydrogen atmosphere.

The process step of forming the additional barrier layer 439 is performed between the process step of forming the aforementioned n-type nitride semiconductor layer 430 and the process step of forming the first well layer 441a.

Through the method of fabricating the nitride semiconductor light emitting device according to the third embodiment of the present invention, the crystal defects existing of the lower structure including a substrate 410, a buffer layer 420 and the n-type nitride semiconductor layer 430 can be prevented from being propagated to the first well layer 441a. Also, dislocations such as defects or inclusions occurring at a boundary between the well layer having the composition of InxGa1−xN ($0 \leq x \leq 1$) and the barrier layer having the composition of InYGa1−YN ($0 \leq y \leq 1$) can be efficiently prevented from being propagated, thereby minimizing the crystal defects of the active layer.

INDUSTRIAL APPLICABILITY

According to the nitride semiconductor light emitting device of the present invention, the barrier layer grown in a high temperature hydrogen atmosphere decreases crystal defects due to a large lattice mismatch between the well layer having the composition of InxGa1−xN ($0 \leq x \leq 1$) and the barrier layer having the composition of InYGa1−YN ($0 \leq y \leq 1$) and enhances the crystallinity of the active layer having the composition of InxGa1−xN ($0 \leq x \leq 1$).

Also, the seed layer having the composition of InzGa1−zN ($0 \leq z \leq 1$) of which In content is high can increase the light emitting efficiency and allow light having a wide wavelength band to be obtained.

In addition, a nitride semiconductor light emitting device with an improved light power and reliability can be obtained.

The invention claimed is:

1. A nitride semiconductor light emitting device comprising:
   a first nitride semiconductor layer;
   an active layer formed on the first nitride semiconductor layer and including at least one pair of layers including a well layer and a barrier layer having an In (indium) composition ratio of 1%<In$\leq$10%; and
   a second nitride semiconductor layer formed on the active layer,
   wherein the at least one pair of layers comprises plural pairs of layers, and the active layer comprises a seed layer containing In(Indium) and interposed between a barrier layer of a lower pair of layers and a well layer of an upper pair of layers, and
   the seed layer has an In composition ratio of more than 10%.

2. The nitride semiconductor light emitting device of claim 1, wherein the at least one pair of layers comprises 4 to 10 pairs of periodically repeated well layers and barrier layers, each pair consisting of one well layer and one barrier layer.

3. The nitride semiconductor light emitting device of claim 1, wherein the seed layer is a single layer of In$_z$Ga$_{1-z}$N ($0<z<1$) or InN.

4. The nitride semiconductor light emitting device of claim 1, wherein the seed layer is 20 Å or less thick.

5. The nitride semiconductor light emitting device of claim 1, wherein the well layer has a composition of In$_z$Ga$_{1-z}$N ($0 \leq x \leq 1$) having an In composition ratio of 10-20%.

6. The nitride semiconductor light emitting device of claim 1, wherein
   the barrier layer of the lower pair of layers has a composition of In$_z$Ga$_{1-z}$N ($0 \leq y \leq 1$),
   the well layer of the upper pair of layers has a composition of In$_z$Ga$_{1-z}$N ($0 \leq x \leq 1$) having an In composition ratio of 10-20%, and
   the seed layer has a composition of In$_z$Ga$_{1-z}$N ($0<z<1$).

7. The nitride semiconductor light emitting device of claim 1, wherein the barrier layer is 30-200 Å thick.

8. The nitride semiconductor light emitting device of claim 1, further comprising:
   an additional barrier layer having a composition of In$_z$Ga$_{1-z}$N ($0 \leq y \leq 1$), the additional barrier located between a well layer of a lowest pair of layers and the first nitride semiconductor layer.

9. The nitride semiconductor light emitting device of claim 1, further comprising:
   a buffer layer formed under the first nitride semiconductor layer; and
   a substrate formed under the buffer layer.

10. A nitride semiconductor light emitting device, comprising:
    a first nitride semiconductor layer;
    an active layer formed on the first nitride semiconductor layer and including at least one sequence of layers, the at least one sequence including a well layer, a barrier layer including In (Indium), and a continuous seed layer having an In (Indium) composition ratio of more than 10%; and
    a second nitride semiconductor layer formed on the active layer.

11. The nitride semiconductor light emitting device of claim 10, wherein the at least one sequence of layers includes 4 to 10 sequences of layers.

12. The nitride semiconductor light emitting device of claim 11, wherein a final layer of the active layer is a final barrier layer formed under the second nitride semiconductor layer.

13. The nitride semiconductor light emitting device of claim 11, wherein a seed layer of a lower sequence is formed under a well layer of an upper sequence and is configured to act as a seed for the well layer of the upper sequence.

14. The nitride semiconductor light emitting device of claim 10, wherein the continuous seed layer is a single layer of $In_zGa_{1-z}N$ (0<z<1) or InN.

15. The nitride semiconductor light emitting device of claim 10, wherein the continuous seed layer is 20 Å or less thick, and the barrier layer is 30-200 Å thick.

16. The nitride semiconductor light emitting device of claim 10, wherein the well layer has a composition of $In_zGa_{1-z}N$ (0≤x≤1) having an In composition ratio of 10-20%, and the barrier layer has an In (indium) composition ratio of less than 10%.

17. The nitride semiconductor light emitting device of claim 10, wherein the barrier layer has a composition of $In_zGa_{1-z}N$ (0≤y≤1), the well layer has a composition of $In_zGa_{1-z}N$ (0≤x≤1) having an In composition ratio of 10-20%, and the continuous seed layer has a composition of $In_zGa_{1-z}N$ (0<z<1) having an In composition ratio is more than 10%.

18. The nitride semiconductor light emitting device of claim 10, further comprising:
    an additional barrier layer having a composition of $In_zGa_{1-z}N$ (0≤y≤1), the additional barrier located between the well layer and the first nitride semiconductor layer.

* * * * *